Figure 1:
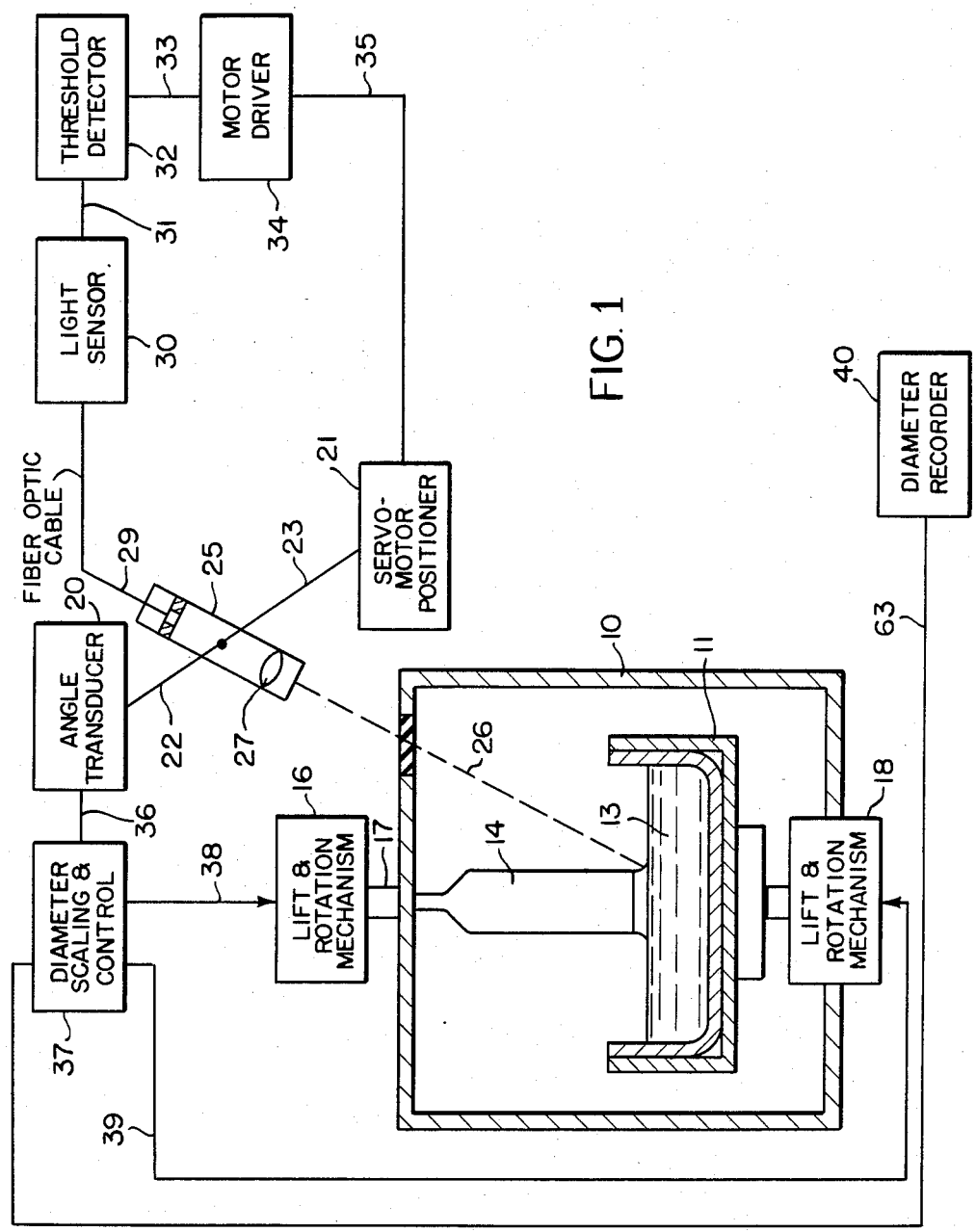

United States Patent [19]

Latka

[11] Patent Number: 4,617,173

[45] Date of Patent: Oct. 14, 1986

[54] SYSTEM FOR CONTROLLING THE DIAMETER OF A CRYSTAL IN A CRYSTAL GROWING FURNACE

[75] Inventor: Henry C. Latka, Rochester, N.Y.

[73] Assignee: General Signal Corporation, Stamford, Conn.

[21] Appl. No.: 676,694

[22] Filed: Nov. 30, 1984

[51] Int. Cl.⁴ ............................................. C30B 15/26
[52] U.S. Cl. .................................... 422/107; 422/249; 156/601
[58] Field of Search .......................... 156/601, 617 SP; 250/571, 572; 356/385, 384; 422/249, 107, 108, 110

[56] References Cited

U.S. PATENT DOCUMENTS

| | | | |
|---|---|---|---|
| 3,692,499 | 9/1972 | Andrychuk | 156/601 |
| 3,740,563 | 6/1973 | Reichard | 156/601 |
| 4,207,293 | 6/1980 | Scholl et al | 356/385 |

Primary Examiner—Hiram H. Bernstein
Attorney, Agent, or Firm—Thomas R. FitzGerald; Harold S. Wynn

[57] ABSTRACT

A crystal growing furnace has lift and rotation control apparatus for both a growing crystal and a crucible containing a melt. A transducer and a servo motor are disposed above the furnace having respective shafts connected along a common horizontal axis on opposite sides of a longitudinal light tube wherein the light tube and transducer shaft can be axially positioned by the shaft of the servo motor. The light tube has a lens for focusing at times on a spot on a meniscus in the furnace and at times on the melt, a light sense detector is connected to the light tube for at times generating a servo motor control error signal to drive the servo motor incrementally to an angular position corresponding to growth in the diameter of the meniscus by tracking a spot on the meniscus. The transducer generates an output signal indicative of incremental angular movement in response to growing the crystal for governing the lift and rotation control apparatus.

3 Claims, 2 Drawing Figures

SYSTEM FOR CONTROLLING THE DIAMETER OF A CRYSTAL IN A CRYSTAL GROWING FURNACE

BACKGROUND OF THE INVENTION

This invention relates to systems for controlling the diameter of a crystal while growing in a crystal growing furnace, and, while the invention is subject to a wide range of applications, a preferred embodiment of the invention will be particularly described as applied to a system responsive to tracking angular movement of a spot of light reflected from a meniscus for governing the growth of the crystal. In the Czochralski puller method of crystal growth operation begins with semiconductor grade polysilicon chunks that are placed in a fused quartz crucible. The crucible is set inside a chamber and is surrounded in the chamber by a heater for melting the polysilicon in a nonreactive atmosphere, and maintaining the temperature of the melt at just above the freezing point. A seed crystal is dipped into the melt and is thereafter slowly raised from the melt as it is rotated in one direction and the melt is rotated in the opposite direction so that the liquid from the melt will adhere to the withdrawing seed crystal and cause an elongated crystal rod to be grown. The diameter of the cystal grows at a rate governed mainly by the rate of lift of the seed relative to the melt and the melt temperature. After the crystal has grown initially to the desired diameter for the crystal, it is desirable that the diameter be closely maintained by regulating the pulling rate, temperature, and the like.

In this method of growing crystals, the seed is vertically suspended by a cable connected to lift and rotation drive apparatus that can be closely regulated, and wherein the crystal is substantially free of vibration from the lift and rotation mechanism. There are, however, conditions where the crystal does not rotate in a perfect circle, and it can move in an orbit, for example, which has a tendency to cause undesirable diameter changes in some systems for sensing the diameter by light reflected from a meniscus, and, in some cases, to completely lose automatic closed loop control of crystal diameter.

An object of the present invention is to provide an improved system for controlling the diameter of a crystal which substantially obviates one or more of the limitations and disadvantages of the described prior art systems.

Other objects, purposes and characteristic features of the present invention will be in part obvious from the accompanying drawings, and in part pointed out as the discription progresses.

SUMMARY OF THE INVENTION

A system for controlling the diameter of a crystal in a crystal growing furnace is provided having a system for tracking a small spot of reflected light on the outside of a meniscus by sensing deviation of light intensity of the spot to generate an error signal for driving a servo motor having its shaft connected to the light tube and also coaxially connected to the shaft of an angle transducer. The angle transducer governs rate of growth by a linear output signal that prevents incorrect diameter determination due to orbiting, and thus grows a crystal of more uniform diameter than the prior art systems of diameter control.

IN THE DRAWINGS

Figure 2:
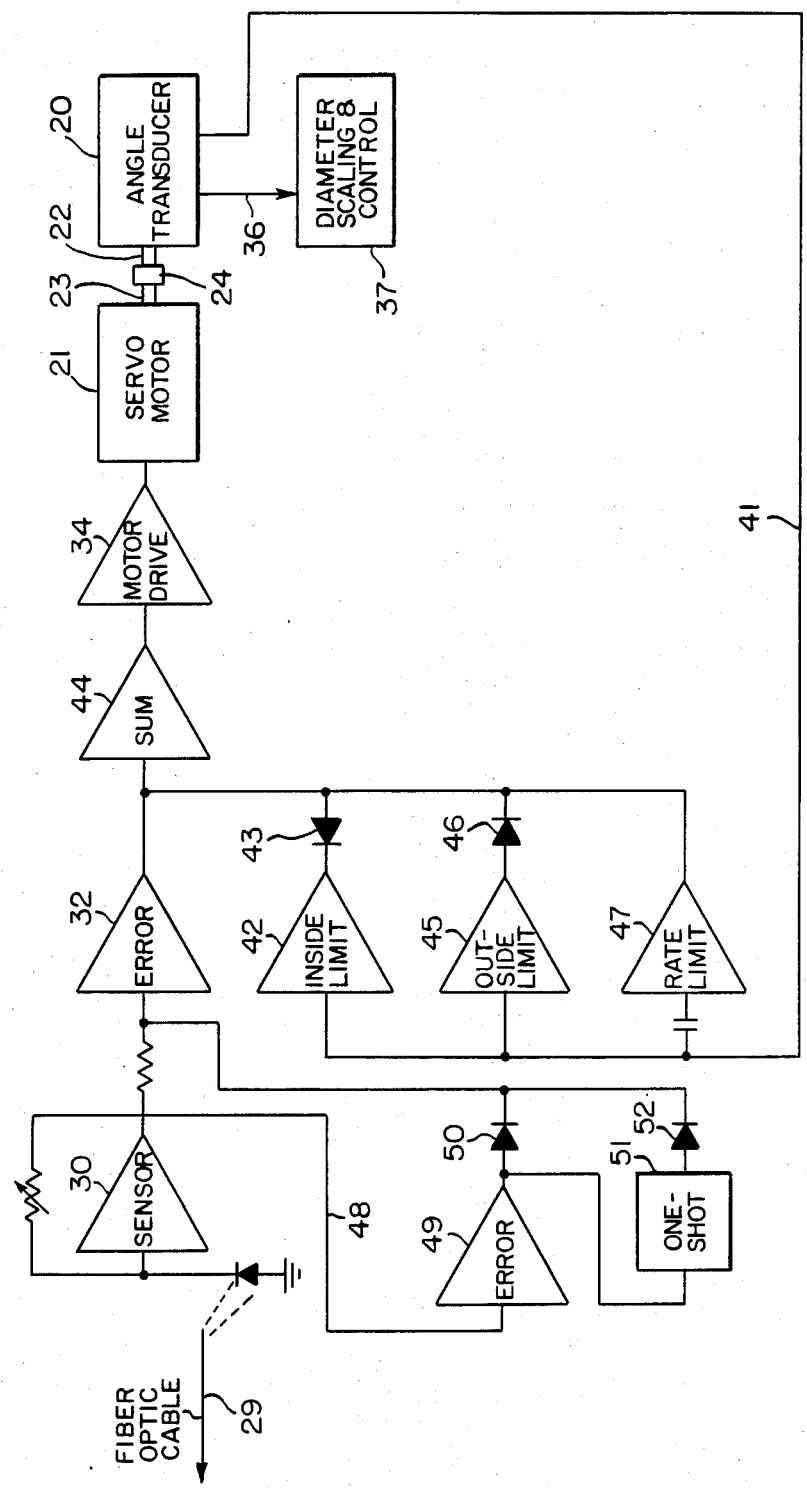

FIG. 1 is in part a sectional elevational diagram of crystal pulling apparatus, and in part a block diagram of diameter control apparatus for regulating the lift and rotation of the crystal to maintain uniform diameter according to a preferred embodiment of the present invention; and, FIG. 2 is a block diagram illustrating more specifically the system of control of the tracking apparatus.

With reference to FIG. 1, a crystal growing apparatus of the Czochralski type is illustrated in which a suitable housing 10 contains a receptacle 11 which is generally of a refractory material such as graphite, containing a crucible 12, which can be of quartz, which in turn contains a silicon melt 13, heated to melting point by a heater (not shown). A crystal 14 is illustrated as being grown from the melt 13, the crystal 14 having a neck 15 drawn from a seed suitably secured to lift and rotation mechanism 16 as is illustrated at 17. This connection 17 generally includes a woven wire cable connection between the seed and the lift mechanism 16 as is well known in this type of crystal growing mechanisms. The lift and rotation mechanism 18 rotates the crucible 12 in a direction opposite to the rotation of the crystal 14 by the lift and rotation mechanism 16.

A relatively bright light is collected by 19 by reflections from the crucible to form a ring of light around the crystal 14 at the point of interface 19 of the crystal 14 with the melt 13 that is commonly called a meniscus.

Crystal diameter control apparatus is disposed above the housing 10, wherein an angle transducer and the servo motor positioner 21 are horizontally disposed in a housing having coaxial shafts 22 and 23 connected end to end in a suitable coupling 24 (see FIG. 2). A light tube 25 passes elevationally through the coupling 24, and is secured therein for tracking a small spot of light on the meniscus reflected frm the interface 19. This light is projected along the dotted line 26, through a lens 27 and an opening 28 near the upper end of tube 25 to shine on the lower end of a fiber optic cable 29. Light from the meniscus is thus applied to a light senser 30 wherein it is converted to a suitable DC voltage signal for application over line 31 to a suitable threshold detector 32. The threshold detector 32 delivers an error signal output over line 33 that is a plus or minus deviation, governed by an input to the threshold detector 32 at 31 that is indicative of a desired light intensity for tracking a spot on the meniscus that is less than the highest intensity reading available of the reflected light. This plus or minus signal that is applied at 33 as input to motor driver 34, governs the polarity of output to the servo motor positioner 21 to actuate that positioner incrementally in one direction or another to correct the angular position of the light tube 25 and restore the tube 25 to a position for tracking a spot of light of the proper light intensity to cause the light senser 30 to delivery a signal over line 31 for causing a null in the output signal from the threshold detector 32 to stop movement of the servo motor positioner in its new position.

Any change in the positioning of the servo motor positioner 21 actuates the shaft 22 of the angle transducer 20 to cause the angle transducer to generate a plus or minus error signal output for delivery over line 36 through a diameter scaling and control 37 and line 38 to the lift and rotation mechanism 16 to modify that control incrementally in accordance with the growth that has been detected in the tracking mechanism. A scaled quantity of the signal at line 38 is also communicated over line 39 to the lower lift and rotation mechanism 18 for the same purpose. Line 63 also applies a control to a suitable diameter recorder 40.

CALIBRATION

To initially calibrate the system, the fiber optic cable 29 is disconnected from light senser 30 and connected to a source of light (not shown) to shine light through the light tube 25 in the reverse direction onto a target having crystal diameter markings thereon that is disposed horizontally on the top of the furnace receptable 11 and adjusted to the normal level of the melt 13. This is done because there is no reflected light from a cold furnace, and thus an external source must be temporarily used in order to insure that the light tube 25 tracks a line that passes through the center of the crystal, and to calibrate the inside and outside limit settings.

By adjusting inside and outside limit potentiometers (not shown) and momentarily manually applying an input potential to the threshold detector 32, inside and outside limits (see FIG. 2) can be set for the angular positioning of the light by the servo motor 21 to establish electronically limits of angular operation of the light tube 25. Typical settings could be that the inside limit would be set at 0.5" from the center line of a crystal, and the outside limit could be set at 1.25" outside of the desired crystal diameter.

Once these limits have been set, in normal operation, output of the angle transducer 20, line 41, inside limit detector 42 and diode 43 applies energy through a summing amplifier 44 to limit the angular operation of the angle transducer in response to the servo motor 21 when it reaches the designated inside limit. Similarly energy of the opposite polarity applied on line 41 renders a prior designated outside limit effective through outside limit detector 45, diode 46, and summing amplifier 44. Also connected in multiple with these circuits is a rate limit operational amplifier 47 that can at times be rendered effective to limit the rate of operation of the tracking apparatus.

OPERATION

When the furnace 10 is off, there is no light reflected through the light tube 25, and thus no signal is applied to threshold detector 32 and the tracker is actuated to the outside limit position. After the furnace 10 is turned on and melts the the contacts of crucible 12, there is some light reflected from the surface of the melt 13, which is converted into an input potential to the threshold detector 32. When this voltage rises above 0.75 volts, it drives the tracker to the inside limit position, and then as a crystal grows to the inside limit position, the voltage increases, by reflection from a spot on the meniscus to its operating voltage of 1.43 volts. The sensor is now locked onto the meniscus so as to deliver incremental error signals to the servo motor to maintain tracking of the growth of the crystal and provide error output signals from the angle transducer for incrementally governing the lift and rotation mechanisms 16 and 18.

As the crystal 13 continues to grow, the servo motor 21 is energized with a polarity to reduce the angle of the light tube 25 relative to the axis of the growing crystal 14 incrementally, which causes an increment change in the output of the angle transducer 20 to correspond to the increased diameter. Thus the tracking mechanism is locked on to a particular portion of the meniscus, and tracks this portion of the meniscus as the crystal grows, the output of the angle transducer 20 being effective through the diameter scaling and control 37 to govern the lift and rotation mechanisms 16 and 18 according to the rate of growth of the crystal 14 as compared to a desired diameter for the crystal 14.

Should the crystal start to orbit, a periodic increased/decreased diameter will be sensed by the tracker, but these high and low portions of the orbit, as read by the tracker tend to average out to provide only a very minimum deviation, if any, from the desired actual diameter measurement of the crystal 14.

With reference to FIG. 2, provision is made for a rescan of the area of the melt between the inside and outside limits that may be required, for example, in case of a momentary loss of power, or the like. This can be provided in response to energy output of a light senser 30 over line 48 through an error amplifier 49 and a diode 50 for an interval time by a 1 shot timer 51 and a diode 52 that are connected in multiple with the diode 50.

Having thus described a system for controlling the diameter of a crystal in a crystal growing furnace responsive to tracking angular movement of a spot of light on a meniscus as a preferred embodiment of the present invention, it is to be understood that various modifications and alterations may be made to the specific embodiment shown, without departing from the spirit or scope of the invention.

What is claimed is:

1. A system for controlling the diameter of a crystal in a crystal growing furnace having an angle transducer connected to a crystal diameter scaling and control means which is in turn connected to rod and crucible lift and rotation mechanisms, a crucible containing a melt, and crystal diameter scaling and control means comprising;
    (a) transducer and servo motor means disposed above a furnace having respective shafts connected along a common axis on opposite sides of a longitunal light tube respectively wherein the light tube and transducer shaft can be angularly positioned by the shaft of the servo motor,
    (b) the light tube having a lens for focusing on a spot on a meniscus in the furnace and at times on the melt,
    (c) light sense detecting and tracking means for at times generating a servo motor control error signal to drive the servo motor to an angular position corresponding to growth in diameter of the meniscus by angularly tracking a spot of light on the meniscus, and
    (d) crystal diameter sensing means governed by a signal from the transducer indicative of the angular position of the light tube when tracking a light spot on the meniscus.

2. A system for controlling the diameter of a crystal in a crystal growing furnace according to claim 1 wherein the angular transducer generates linear output signals for incrementally sensing changes in crystal diameter, thus limiting overcorrection due to intermittent diameter changes caused by orbiting of a crystal.

3. A system for controlling the diameter of a crystal according to claim 2 wherein a threshold detector is provided for obtaining close loop operation of the servo motor, thus causing the angularly positioned light tube to follow a certain reflected light level from the meniscus.

* * * * *